United States Patent
Mathe et al.

(10) Patent No.: US 8,754,707 B2
(45) Date of Patent: Jun. 17, 2014

(54) BOOST CONVERTER CONTROL FOR ENVELOPE TRACKING

(71) Applicant: QUALCOMM Incorporated, San Diego, CA (US)

(72) Inventors: Lennart Karl-Axel Mathe, San Diego, CA (US); Song S Shi, San Diego, CA (US); Yunfei Shi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 57 days.

(21) Appl. No.: 13/659,667

(22) Filed: Oct. 24, 2012

(65) Prior Publication Data

US 2014/0111276 A1   Apr. 24, 2014

(51) Int. Cl.
*H03G 3/20* (2006.01)

(52) U.S. Cl.
USPC .......................................................... 330/127

(58) Field of Classification Search
CPC .... H03F 1/0211; H03F 1/0233; H03F 1/0238
USPC ......................................... 330/127, 199, 297
See application file for complete search history.

(56) References Cited

U.S. PATENT DOCUMENTS

| | | | |
|---|---|---|---|
| 6,437,641 B1 | 8/2002 | Bar-David | |
| 6,985,039 B2 | 1/2006 | Bar-David et al. | |
| 8,019,293 B2 | 9/2011 | Dagher et al. | |
| 8,193,860 B2 | 6/2012 | Cohen | |
| 8,212,620 B2 * | 7/2012 | Strickland et al. | 330/297 |
| 2009/0004981 A1 | 1/2009 | Eliezer et al. | |
| 2011/0221523 A1 | 9/2011 | Dupis et al. | |
| 2012/0206203 A1 | 8/2012 | Cozzolino | |

OTHER PUBLICATIONS

Kim, et al. "High Efficiency and Wideband Envelope Tracking Power Amplifier with Sweet Spot Tracking," 2010 IEEE Radio Frequency Integrated Circuits Symposium, pp. 255-258.

* cited by examiner

*Primary Examiner* — Steven J Mottola
(74) *Attorney, Agent, or Firm* — William M. Hooks

(57) ABSTRACT

Techniques for controlling boost converter operation in an envelope tracking (ET) system. In an aspect, an enable generation block is provided to generate an enable signal for a boost converter, wherein the enable signal is turned on in response to detecting that a sum of a first headroom voltage and an enable peak of a tracking supply voltage is greater than an amplifier supply voltage of the ET system. The enable signal may be turned on for a predetermined enable on duration. In another aspect, a target generation block is provided to generate a target voltage for the boost converter, wherein the target voltage comprises the sum of a second headroom voltage and a target peak of the tracking supply voltage.

20 Claims, 8 Drawing Sheets

BOOST CONVERTER CONTROL FOR ENVELOPE TRACKING

BACKGROUND

1. Field

The disclosure relates to envelope tracking for power amplifiers.

2. Background

Envelope tracking is a technique for increasing the efficiency of power amplifiers. In an envelope tracking (ET) system, the supply voltage of a power amplifier is dynamically adjusted to keep the power amplifier operating with sufficient headroom to maintain linearity, while nevertheless minimizing DC power consumption. The supply voltage of the power amplifier may be generated using a separate linear amplifier that tracks the envelope of the power amplifier output. In certain implementations, the linear amplifier is itself coupled to an amplifier supply voltage generated by a boost converter, which is capable of generating a boosted supply voltage for the linear amplifier that exceeds the maximum supply voltage otherwise available to the system, e.g., a battery voltage. In this manner, the power amplifier output can reach and even exceed the battery voltage when necessary.

To increase efficiency, the boost converter may generate a boosted supply voltage for the linear amplifier only when necessary to provide sufficient headroom to the power amplifier. When the boost converter is not turned on, a bypass mode may be provided in which the battery voltage is directly coupled to the amplifier as the amplifier supply voltage.

In view of the desire to provide improved efficiency for ET systems, it would be desirable to provide techniques for determining when to enable a boost converter to generate the boosted supply voltage, and further for determining the target voltage to which the boosted supply voltage should be driven when the boost converter is enabled.

DETAILED DESCRIPTION

Figure 1:
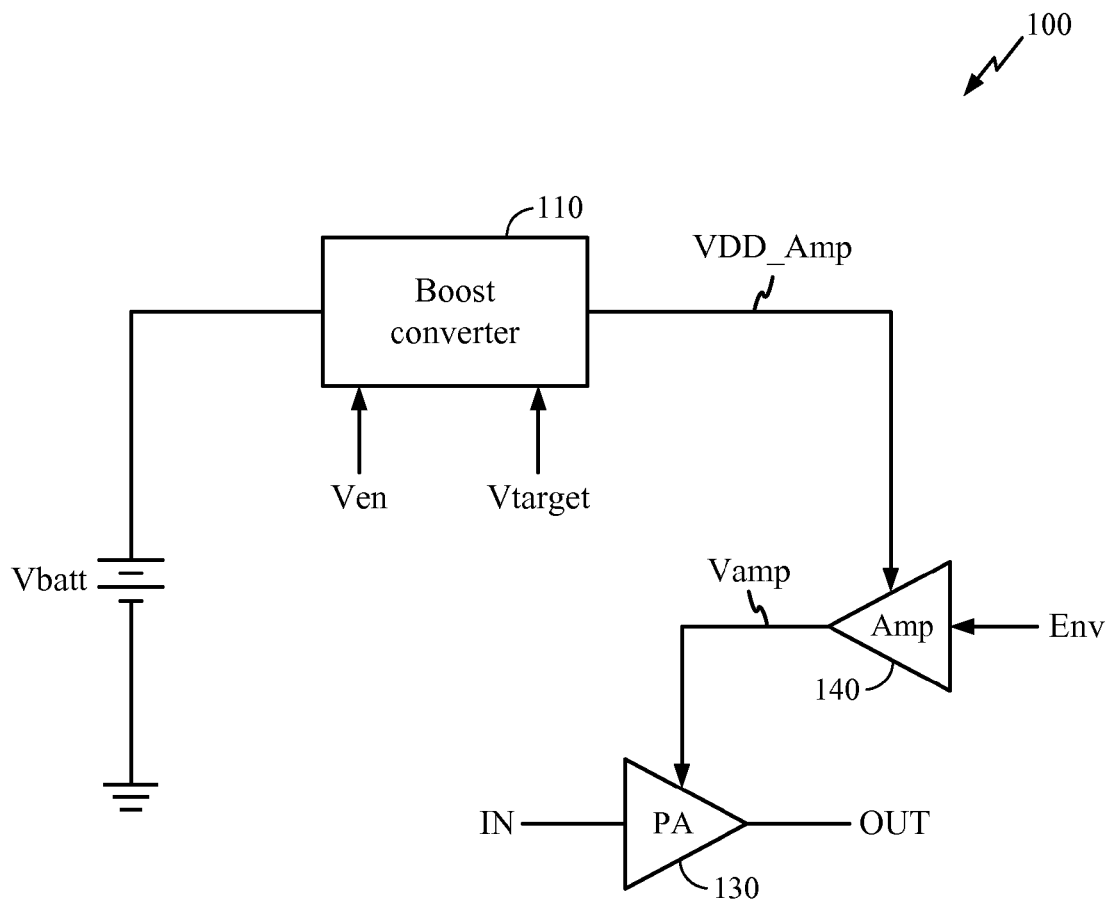
FIG. 1 illustrates an implementation of an envelope tracking (ET) system.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Note in this specification and in the claims, the denotation of a signal or voltage as being "high" or "low" may refer to such signal or voltage being in a logical "high" or "low" state, which may (but need not) correspond to a "TRUE" (e.g., =1) or "FALSE" (e.g., =0) state for the signal or voltage. It will be appreciated that one of ordinary skill in the art may readily modify the logical conventions described herein, e.g., substitute "high" for "low" and/or "low" for "high," to derive circuitry having functionality substantially equivalent to that described herein. Such alternative exemplary embodiments are contemplated to be within the scope of the present disclosure.

FIG. 1 illustrates an implementation of an envelope tracking (ET) system 100. Note FIG. 1 is shown for illustrative purposes only, and is not meant to limit the scope of the present disclosure to any particular implementation of an ET system. For example, the techniques described hereinbelow may readily be applied to systems incorporating alternative or additional modules not shown in FIG. 1, such as a buck converter coupling Vbatt to Vamp for generating a stepped-down voltage supply for the power amplifier.

In FIG. 1, a power amplifier (PA) 130 receives an input voltage IN and generates an amplified output voltage OUT. A voltage Vamp, also denoted a "tracking supply voltage," is provided to the PA 130 as a supply voltage. Vamp is generated at least in part by an amplifier 140. The amplifier 140 is supplied by a voltage VDD_Amp, also denoted an "amplifier supply voltage." In certain implementations of an ET system, to generate Vamp, the amplifier 140 may amplify a voltage Env which tracks the envelope of the PA output voltage OUT.

Note amplifier 140 may generally be any type of amplifier known in the art, e.g., class A, class B, class AB, etc. Such exemplary embodiments are contemplated to be within the scope of the present disclosure.

The tracking supply voltage Vamp provided to the PA 130 may be maintained at a level sufficient to ensure linear operation of the PA 130, i.e., provided with sufficient "headroom," while reducing unnecessary DC power consumption. Note as mentioned hereinabove, in certain implementations, a buck converter (not shown) may be concurrently provided to supply the PA 130, e.g., coupled to the PA 130 at Vamp to increase the power driving capability of the PA 130.

In certain operating scenarios, to maintain sufficient headroom for the PA, it may be necessary to drive Vamp to a level that exceeds the level of Vbatt, which is a maximum supply voltage otherwise available to the system, e.g., a supply voltage from a battery of the system. Note Vbatt may also be denoted herein as a "boost supply voltage." To allow the amplifier 140 to generate an output Vamp that is higher than Vbatt, a boost converter 110 may be provided to generate VDD_Amp. The boost converter 110 may boost VDD_Amp to a higher level than Vbatt according to principles of operation not shown in FIG. 1 but known in the art, e.g., using a plurality of switches alternately configured to charge and discharge an inductor to generate a boosted output voltage.

To increase the efficiency of the ET system, the boost converter 110 may be turned on or enabled only when necessary, e.g., when it is determined that VDD_Amp needs to rise above Vbatt to maintain sufficient headroom for the PA 130. As such, the boost converter 110 may receive as input an "enable" signal voltage Ven indicating when VDD_Amp should be boosted to a level higher than VBatt, i.e., when the boost converter 110 should be enabled or turned on. In this specification and in the claims, the event corresponding to Ven signaling that the boost converter 110 should be enabled may also be denoted the event of an "enable signal" being "turned on."

The boost converter 110 may also be provided with a target voltage Vtarget indicating the level to which VDD_Amp should be boosted when the boost converter 110 is enabled. It will be appreciated that when it is not necessary to provide VDD_Amp higher than Vbatt, the boost converter 110 may be turned off or disabled, or otherwise provided in a "bypass" mode that directly couples Vbatt to VDD_Amp.

Figure 2:
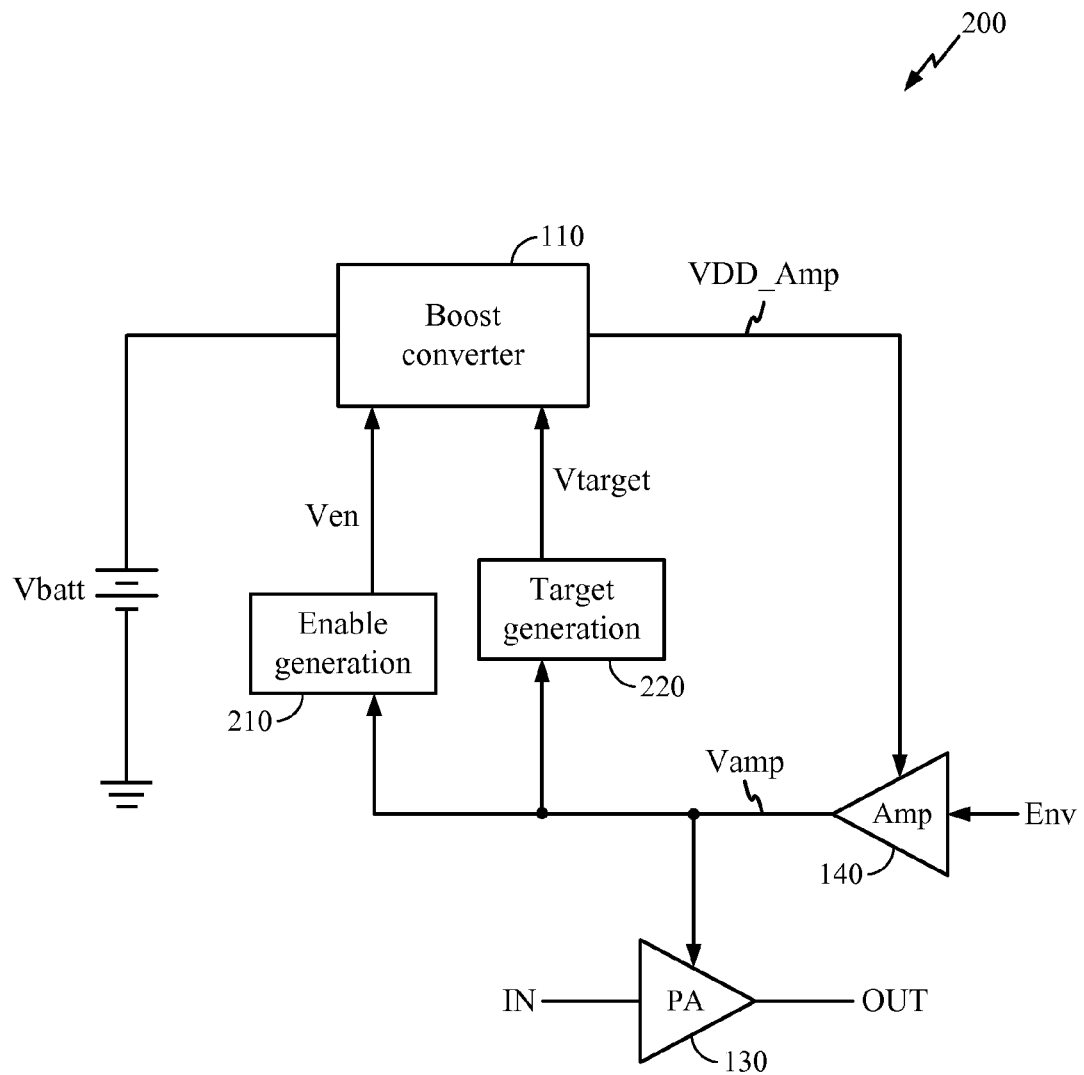
FIG. 2 illustrates an implementation of an ET system wherein Ven and Vtarget are generated using Vamp as an input.

FIG. 2 illustrates an implementation of an ET system 200 wherein Ven and Vtarget are generated using Vamp as an input. Note FIG. 2 is shown for illustrative purposes only, and is not meant to limit the scope of the present disclosure to any particular techniques for generating Ven and/or Vtarget.

In FIG. 2, an enable generation block 210 is coupled to Vamp to generate the enable voltage Ven. A target generation block 220 is coupled to Vamp to generate the target voltage Vtarget.

Note FIG. 2 is shown for illustrative purposes only, and is not meant to limit the scope of the present disclosure to ET systems wherein Ven and Vtarget are necessarily generated as shown. For example, in certain implementations (not shown), Vtarget may be generated from Vamp as shown in FIG. 2, while Ven may be generated using other techniques known in the art (e.g., independently of Vamp, and/or using software-based event-driven techniques); similarly Ven may be generated from Vamp, and Vtarget generated using other techniques. Such alternative implementations are contemplated to be within the scope of the present disclosure.

Figure 3:
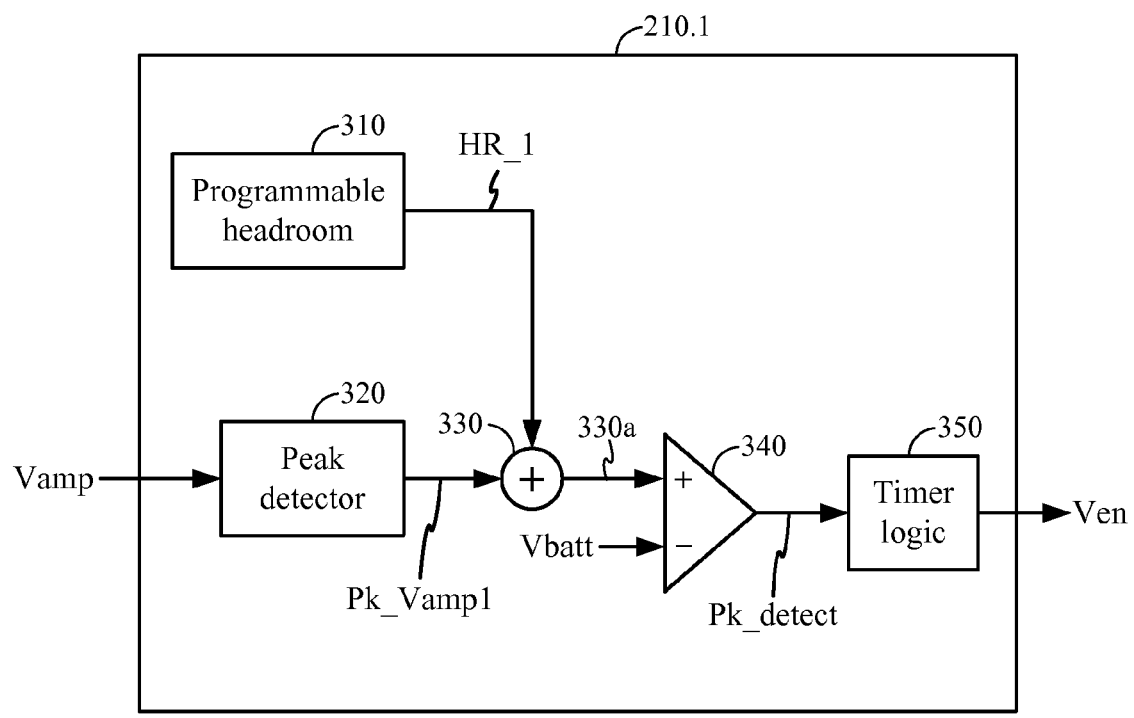
FIG. 3 illustrates an exemplary embodiment of the enable generation block according to the present disclosure.

FIG. 3 illustrates an exemplary embodiment 210.1 of the enable generation block 210 according to the present disclosure. Note FIG. 3 is shown for illustrative purposes only, and is not meant to limit the scope of the present disclosure to exemplary embodiments incorporating the techniques shown.

In FIG. 3, Vamp is coupled to a peak detector 320 configured to detect the peak value in Vamp over a first predetermined time window, e.g., TWIN1. The detected peak value in Vamp is output as a voltage Pk_Vamp1, also denoted herein as an "enable peak." Furthermore, a programmable headroom block 310 generates a predetermined headroom voltage HR_1, or a "first headroom voltage." HR_1 may be a static value, or it may correspond to the contents of a register (not shown) that may be dynamically written to using, e.g., a microprocessor, etc. (not shown in FIG. 3).

An adder 330 adds Pk_Vamp1 to HR_1 to generate a signal 330a, which is coupled to the positive (+) input of a comparator 340. A negative (−) input of the comparator 340 is coupled to Vbatt. The comparator 340 generates an output voltage Pk_detect. Pk_detect provides an indication of whether the peak value Pk_Vamp1 of Vamp plus a headroom voltage HR_1 exceeds the voltage Vbatt. If Pk_detect is high, then, to provide sufficient headroom to the PA 130, the boost converter 110 should be enabled to generate a VDD_Amp higher than Vbatt.

Further shown in FIG. 3 is a timer logic block 350 which generates the enable voltage Ven from the voltage Pk_detect. The operation of the timer logic block 350 is described with reference to the method 400 of FIG. 4. Note the method 400 is shown for illustrative purposes only, and is not meant to limit the scope of the present disclosure to exemplary embodiments of timer logic blocks necessarily incorporating the method shown.

Figure 4:
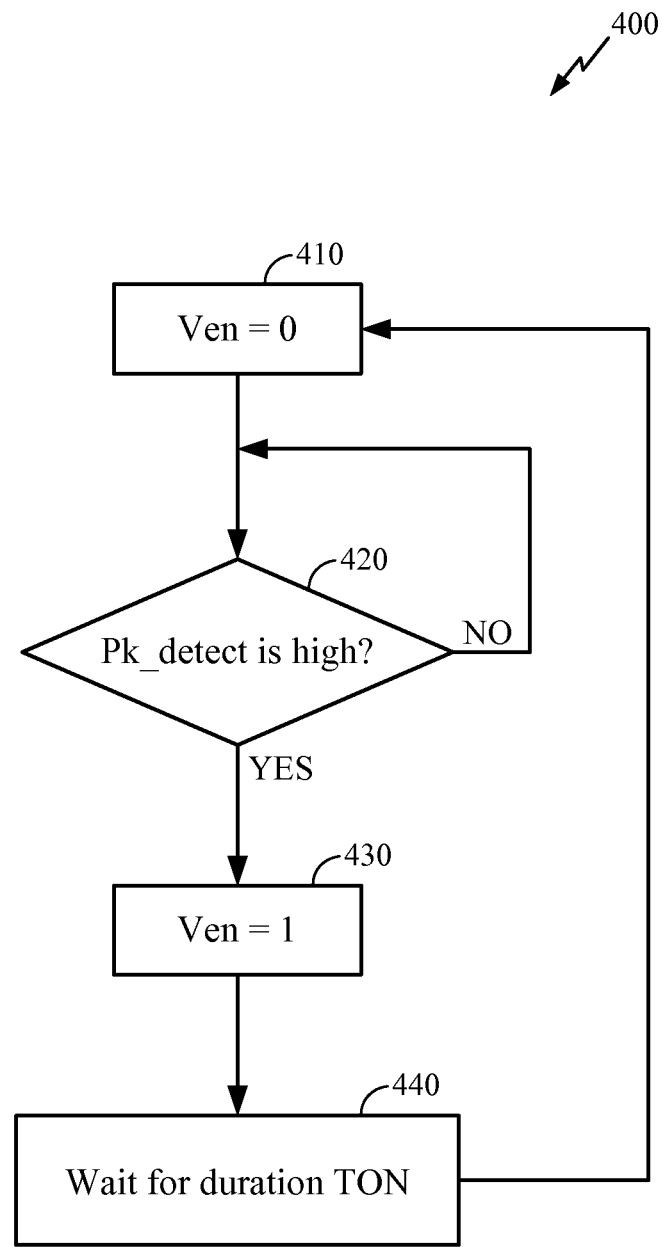
FIG. 4 illustrates an exemplary embodiment of a timer logic block which generates the enable voltage Ven from the voltage Pk_detect.

In FIG. 4, at block 410, Ven is initially set to 0, corresponding to the boost converter 110 being disabled, or being configured in a bypass mode.

At block 420, it is detected whether Pk_detect is high. If yes, the method proceeds to block 430. If no, the method continues to wait at block 420.

At block 430, Ven is set to 1. In an exemplary embodiment, it will be appreciated that the boost converter 110 may be enabled when Ven is set to 1, e.g., to boost VDD_Amp to a level higher than Vbatt.

At block 440, the method keeps Ven equal to 1 for a duration TON. In an exemplary embodiment, TON is denoted an "enable on duration," and may be a pre-programmed duration, e.g., corresponding to the contents of a register (not shown) that may be written to using, e.g., a microprocessor, etc. (not shown in FIG. 4). After TON has elapsed, the method may proceed back to block 410, wherein Ven may again be set to 0.

In an exemplary embodiment, the duration of TON may be measured out using a counter (not shown) driven by a clock having a predetermined frequency. One of ordinary skill in the art will appreciate that alternative techniques may readily be employed to measure TON, and such alternative exemplary embodiments are contemplated to be within the scope of the present disclosure.

Figure 5:
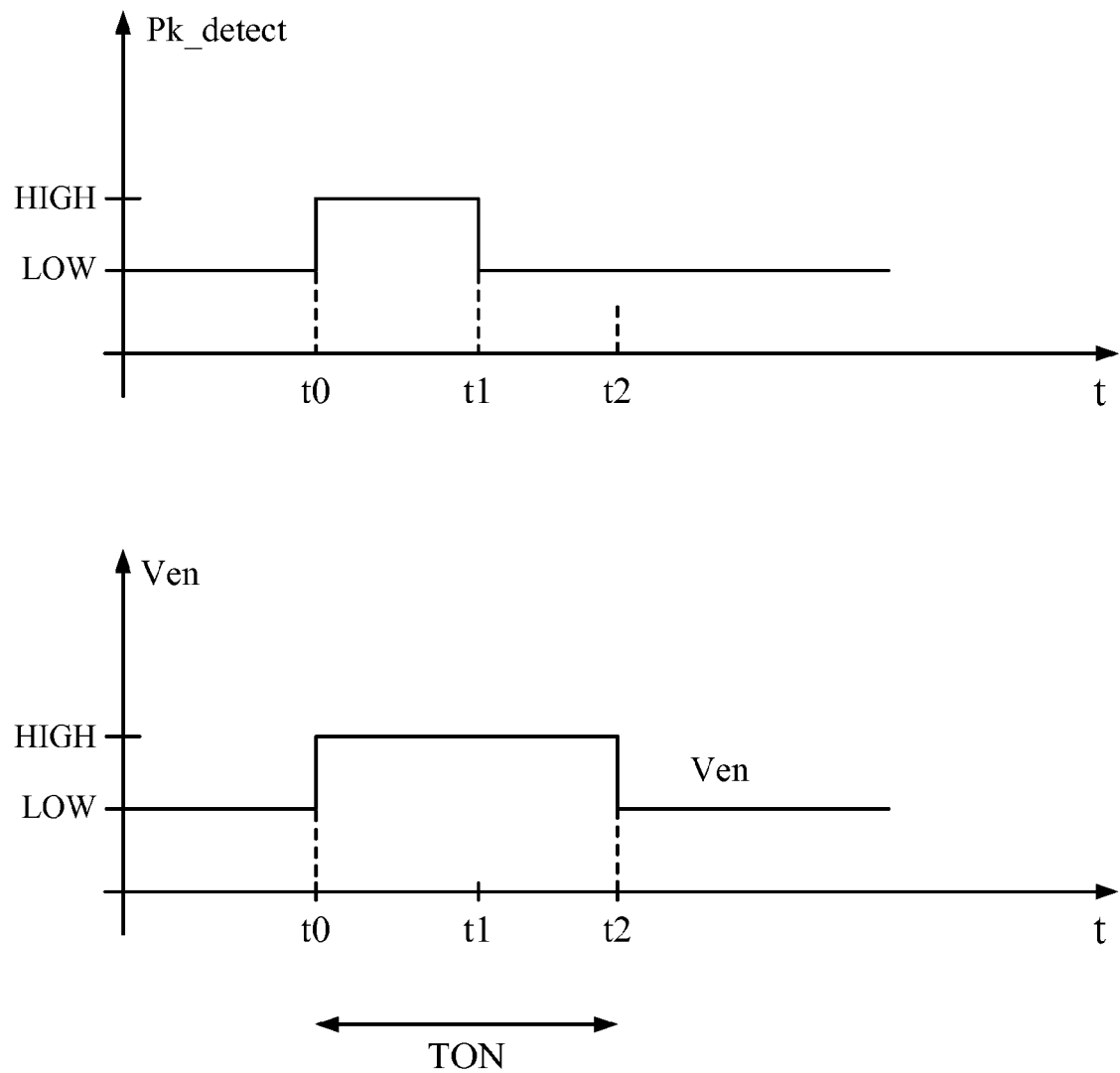
FIG. 5 illustrates exemplary signal timing diagrams corresponding to the timer logic block implementing the method shown in FIG. 4.

FIG. 5 illustrates exemplary signal timing diagrams corresponding to the timer logic block 350 implementing the method 400. Note FIG. 5 is shown for illustrative purposes only, and is not meant to restrict the scope of the present disclosure to signals having the specific timing relationships shown.

In FIG. 5, at time t0, Pk_detect is seen to transition from low to high. This may correspond to, e.g., the voltage 330a in FIG. 3 transitioning from being less than Vbatt prior to t0 to being greater than Vbatt at t0.

Correspondingly at time t0, Ven is seen to transition from low to high, in response to Pk_detect transitioning high. The setting of Ven=1 may be performed in accordance with, e.g., block 430 in FIG. 4.

Ven is seen to remain high until a time t2, when Ven transitions from high to low. The duration between t0 and t2 may correspond to the enable on duration TON previously described hereinabove with reference to block 440 of FIG. 4. In particular, Ven transitions from low to high at t0 in response to detecting Pk_detect being high, and Ven stays high for a duration TON before returning to low. Note Ven stays high following the rising edge of Pk_detect regardless of any transitioning in Pk_detect between t0 and t2, e.g., Ven stays high when a falling edge of Pk_detect occurs at t1.

In an exemplary embodiment, it will be appreciated that the addition performed by adder 330 to generate voltage 330*a* may occur even when the boost converter 110 is shut off, i.e., adder 330 and comparator 340 may function continuously to assess whether Ven needs to be asserted high, regardless of the on-off state of the boost converter 110.

While an exemplary embodiment of a method 400 executed by the timer logic block 350 of enable generation block 210.1 has been described herein, it will be appreciated that alternative methods may readily be derived in light of the present disclosure. For example, in alternative exemplary embodiments (not shown), the enable on duration TON is a parameter that may be re-programmed by writing into the contents of an "enable on duration" register (not shown). Furthermore, while an "enable on interval," corresponding to when Ven is high, is shown as lasting for a duration TON after Pk_detect goes high, e.g., as shown at block 440 in FIG. 4 and between times t0 and t2 of FIG. 5, in alternative exemplary embodiments, the enable on interval may be chosen to start or stop based on other events. For example, the enable on interval may commence on a rising edge of Pk_detect, and persist until a duration TON' after a falling edge in Pk_detect, i.e., the enable on interval may last for a duration of t1−t0+TON'. Such alternative exemplary embodiments and other alternative exemplary embodiments derivable by one of ordinary skill in the art in light of the present disclosure (but not explicitly described herein) are contemplated to be within the scope of the present disclosure.

Figure 6:
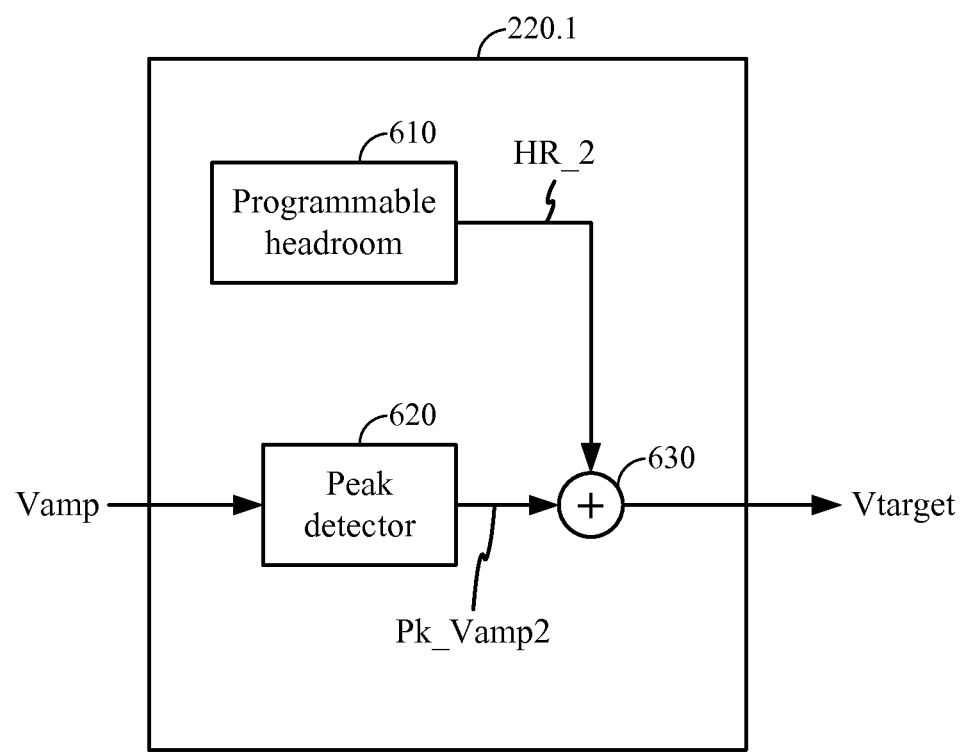
FIG. 6 illustrates an exemplary embodiment of a target generation block according to the present disclosure.

FIG. 6 illustrates an exemplary embodiment 220.1 of a target generation block 220 according to the present disclosure. Note FIG. 6 is shown for illustrative purposes only, and is not meant to limit the scope of the present disclosure to exemplary embodiments incorporating the techniques shown.

In FIG. 6, Vamp is coupled to a peak detector 620 configured to detect the peak value in Vamp over a second predetermined time window, e.g., TWIN2. Note the time window TWIN2 employed by peak detector 620 of the target generation block 220.1 may generally be independent of the time window TWIN1 employed by peak detector 320 of the enable generation block 210.1, i.e., the peak detection time windows used for enable and target generation may be different from each other. In certain alternative exemplary embodiments, however, the time windows may be the same. All such alternative exemplary embodiments are contemplated to be within the scope of the present disclosure.

The output Pk_Vamp2, also denoted herein as a "target peak," of peak detector 620 is coupled to an adder 630, which adds Pk_Vamp2 with a headroom voltage HR__2, or "second headroom voltage," generated by a programmable headroom block 610, to generate Vtarget. Note HR__2 generated by block 610 may be independent of HR__1 generated by programmable headroom block 310 of the enable generation block 210.1, i.e., the headroom voltages used for enable and target generation may generally be independent from each other. In certain alternative exemplary embodiments, however, the headroom voltages may be the same. All such alternative exemplary embodiments are contemplated to be within the scope of the present disclosure. The output of adder 630 may be provided as the target voltage Vtarget for the boost converter 110.

Figure 7:
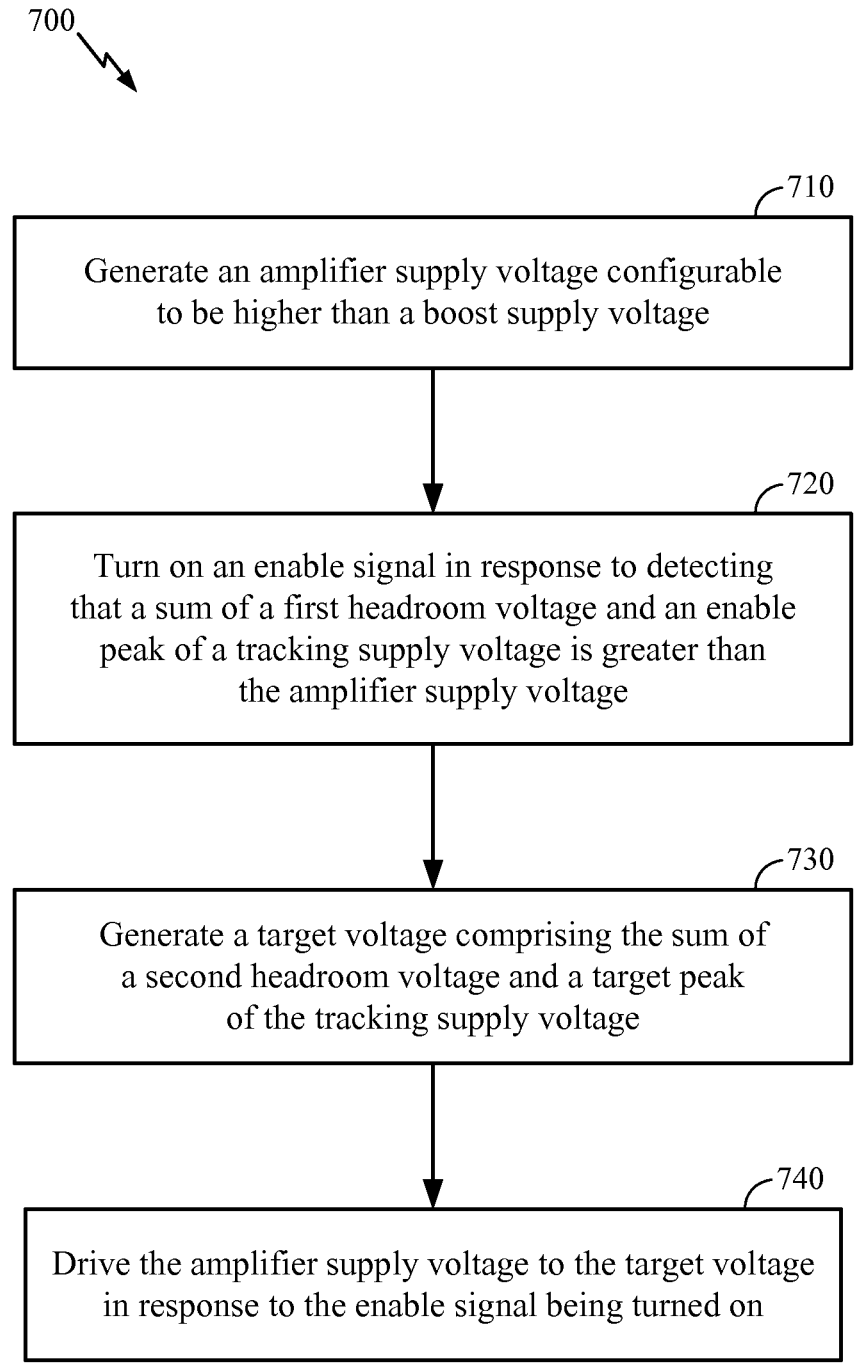
FIG. 7 illustrates an exemplary embodiment of a method according to the present disclosure.

FIG. 7 illustrates an exemplary embodiment of a method 700 according to the present disclosure. Note FIG. 7 is shown for illustrative purposes only and is not meant to limit the scope of the present disclosure to any particular exemplary embodiment of a method described.

In FIG. 7, at block 710, an amplifier supply voltage configurable to be higher than a boost supply voltage is generated.

At block 720, an enable signal is turned on in response to detecting that a sum of a first headroom voltage and an enable peak of a tracking supply voltage is greater than the amplifier supply voltage.

At block 730, a target voltage comprising the sum of a second headroom voltage and a target peak of the tracking supply voltage is generated.

At block 740, the amplifier supply voltage is driven to the target voltage in response to the enable signal being turned on.

Figure 8:
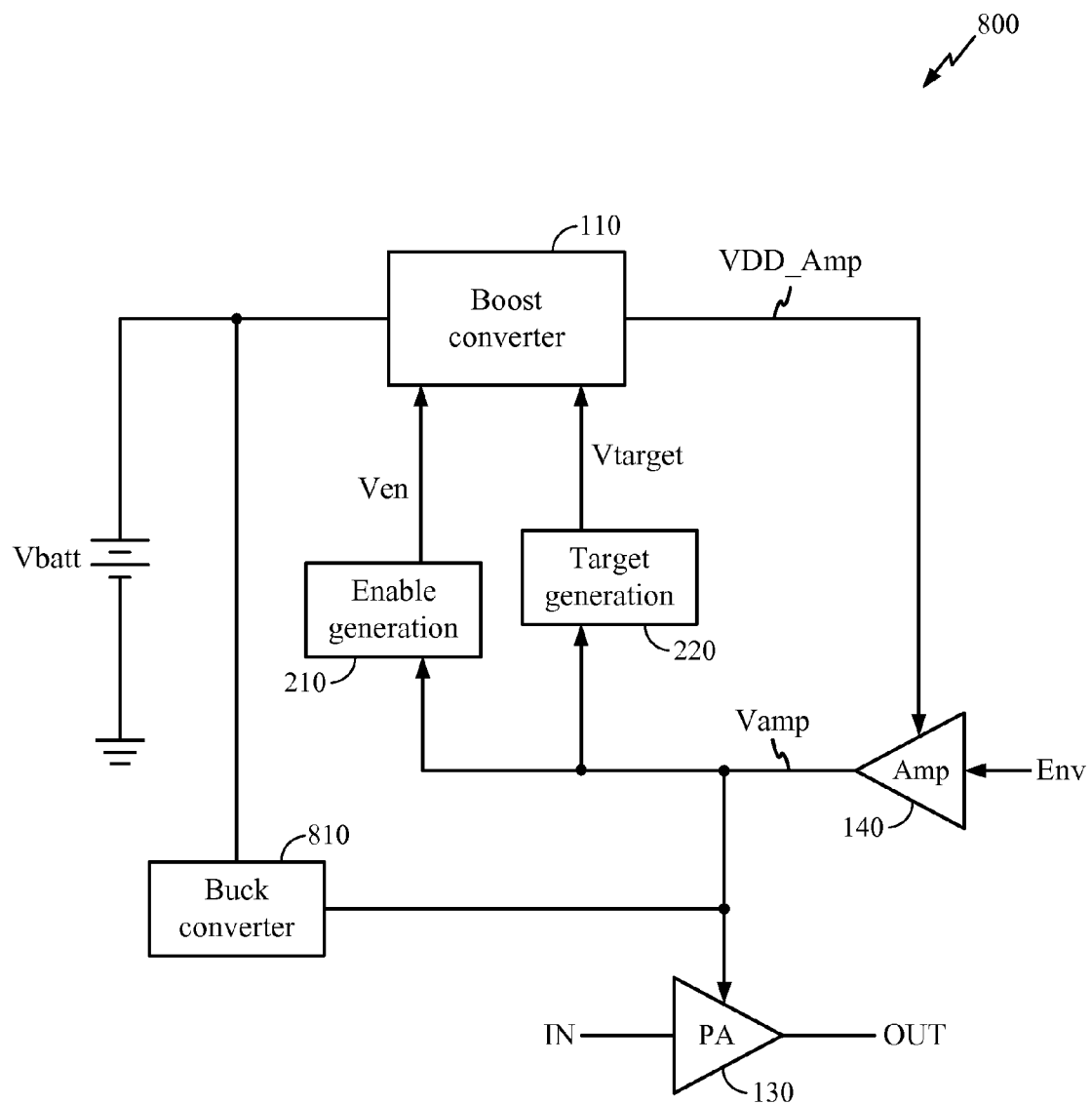
FIG. 8 illustrates an alternative exemplary embodiment of the present disclosure, wherein a buck converter is further coupled to Vamp.

FIG. 8 illustrates an alternative exemplary embodiment 800 of the present disclosure, wherein a buck converter is further coupled to Vamp. Note FIG. 8 is shown for illustrative purposes only, and is not meant to limit the scope of the present disclosure to exemplary embodiments incorporating a buck converter. Further note that similarly labeled elements in FIGS. 2 and 8 may correspond to elements performing similar functionality, unless otherwise noted.

In FIG. 8, a buck converter 810 is coupled to the tracking supply voltage Vamp of PA 130. The buck converter 810 may convert Vbatt to a level of Vamp lower than Vbatt when necessary. The buck converter 810 may generate a level of Vamp less than Vbatt according to principles of operation not shown in FIG. 1 but known in the art, e.g., using a plurality of switches alternately configured to charge and discharge an inductor to generate a stepped-down output voltage. It will be appreciated that the buck converter 810 may supply, e.g., the low-frequency content of the power supply to the PA 130, while the amplifier 140 may supply higher-frequency content of the power supply to the PA 130 arising from, e.g., fluctuations in the envelope of the PA output voltage.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
an enable generation block configured to turn on an enable signal in response to detecting that a sum of a first headroom voltage and an enable peak of a tracking supply voltage is greater than an amplifier supply voltage; and
a target generation block configured to generate a target voltage comprising the sum of a second headroom voltage and a target peak of the tracking supply voltage;
wherein a boost converter is configurable to generate the amplifier supply voltage higher than a boost supply voltage coupled to the boost converter, and wherein the boost converter is configured to be enabled in response to the enable signal being turned on and, when enabled, to drive the amplifier supply voltage to the target voltage.

2. The apparatus of claim 1, further comprising an amplifier supplied by the amplifier supply voltage, wherein the amplifier is a class AB amplifier configured to output the tracking supply voltage, the tracking supply voltage supplied to a power amplifier configured to amplify an input voltage to generate an output voltage.

3. The apparatus of claim 2, further comprising the power amplifier, wherein the amplifier is configured to generate the tracking supply voltage from an envelope signal that tracks the envelope of the power amplifier output voltage.

4. The apparatus of claim 1, wherein the enable peak of the tracking supply voltage corresponds to the peak of the tracking supply voltage over a first predetermined time interval.

5. The apparatus of claim 4, wherein the target peak of the tracking supply voltage corresponds to the peak of the tracking supply voltage over a second predetermined time interval, wherein the first and the second predetermined time intervals are different from each other.

6. The apparatus of claim 4, wherein the target peak and the enable peak are identical.

7. The apparatus of claim 1, wherein the first and second headroom voltages are different from each other.

8. The apparatus of claim 1, wherein the enable generation block is configured to turn on the enable signal for a predetermined enable on duration.

9. The apparatus of claim 1, further comprising a buck converter coupled to the tracking supply voltage.

10. The apparatus of claim 1, wherein the enable generation block is configured to detect the sum being greater than the amplifier supply voltage when the boost converter is disabled.

11. A method comprising:
generating an amplifier supply voltage configurable to be higher than a boost supply voltage;
turning on an enable signal in response to detecting that a sum of a first headroom voltage and an enable peak of a tracking supply voltage is greater than the amplifier supply voltage;
generating a target voltage comprising the sum of a second headroom voltage and a target peak of the tracking supply voltage;
driving the amplifier supply voltage to the target voltage in response to the enable signal being turned on.

12. The method of claim 11, further comprising:
supplying the amplifier supply voltage to an amplifier configured to output a tracking supply voltage; and
supplying the tracking supply voltage to a power amplifier configured to amplify an input voltage to generate an output voltage; wherein the amplifier is configured to generate the tracking supply voltage from an envelope signal that tracks the envelope of the power amplifier output voltage.

13. The method of claim 11, further comprising keeping the enable signal on for a predetermined enable on duration.

14. The method of claim 11, further comprising:
generating the enable peak by detecting the peak of the tracking supply voltage over a first predetermined time interval; and
generating the target peak by detecting the peak of the tracking supply voltage over a second predetermined time interval different from the first predetermined time interval.

15. The method of claim 11, further comprising:
detecting the sum of the first headroom voltage and the enable peak being greater than the amplifier supply voltage when the amplifier supply voltage is not configured to be higher than the boost supply voltage.

16. An apparatus comprising:
means for generating an amplifier supply voltage configurable to be higher than a boost supply voltage;
means for turning on an enable signal in response to detecting that a sum of a first headroom voltage and an enable peak of a tracking supply voltage is greater than the amplifier supply voltage;
means for generating a target voltage comprising the sum of a second headroom voltage and a target peak of the tracking supply voltage;
means for driving the amplifier supply voltage to the target voltage in response to the enable signal being turned on.

17. The apparatus of claim 16, further comprising:
means for supplying the amplifier supply voltage to an amplifier configured to output a tracking supply voltage; and
means for supplying the tracking supply voltage to a power amplifier configured to amplify an input voltage to generate an output voltage; wherein the amplifier is configured to generate the tracking supply voltage from an envelope signal that tracks the envelope of the power amplifier output voltage.

18. The apparatus of claim 16, further comprising:
means for keeping the enable signal on for a predetermined enable on duration.

19. The apparatus of claim 16, further comprising:
means for generating the enable peak by detecting the peak of the tracking supply voltage over a first predetermined time interval; and
means for generating the target peak by detecting the peak of the tracking supply voltage over a second predetermined time interval different from the first predetermined time interval.

20. The apparatus of claim 16, further comprising:
means for detecting the sum of the first headroom voltage and the enable peak being greater than the amplifier supply voltage when the amplifier supply voltage is not configured to be higher than the boost supply voltage.

* * * * *